(12) United States Patent
Ye et al.

(10) Patent No.: US 9,966,953 B2
(45) Date of Patent: May 8, 2018

(54) LOW CLOCK POWER DATA-GATED FLIP-FLOP

(71) Applicant: QUALCOMM Incorporated, San Deigo, CA (US)

(72) Inventors: Qi Ye, San Diego, CA (US); Animesh Datta, San Diego, CA (US); Bo Pang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/171,487

(22) Filed: Jun. 2, 2016

(65) Prior Publication Data
US 2017/0353186 A1    Dec. 7, 2017

(51) Int. Cl.
H03K 3/037    (2006.01)
H03K 19/21    (2006.01)
H03K 19/00    (2006.01)

(52) U.S. Cl.
CPC ......... *H03K 19/0016* (2013.01); *H03K 3/037* (2013.01); *H03K 19/21* (2013.01)

(58) Field of Classification Search
CPC ..... H03K 3/037; H03K 19/0016; H03K 19/21
USPC ................... 326/52; 327/199, 215, 218, 225
See application file for complete search history.

(56) References Cited

U.S. PATENT DOCUMENTS

| | | | |
|---|---|---|---|
| 4,414,480 A | 11/1983 | Zasio | |
| 4,568,842 A | 2/1986 | Koike | |
| 5,041,741 A | 8/1991 | Steele | |
| 5,065,054 A | 11/1991 | Nguyen et al. | |
| 5,132,563 A | 7/1992 | Fujii et al. | |
| 5,179,298 A | 1/1993 | Hirano et al. | |
| 5,291,078 A | 3/1994 | Chao et al. | |
| 5,467,044 A | 11/1995 | Ashe et al. | |
| 5,886,901 A | 3/1999 | Magoshi | |
| 5,990,700 A | 11/1999 | Park | |
| 6,021,504 A | 2/2000 | Yamasaki | |
| 6,140,835 A | 10/2000 | Shirai | |
| 6,198,334 B1 | 3/2001 | Tomobe et al. | |

(Continued)

FOREIGN PATENT DOCUMENTS

JP    H01286609 A    11/1989
WO    2008138113 A1    11/2008

OTHER PUBLICATIONS

Strollo A.G.M., et al., "New Clock-Gating Techniques for Low-Power Flip-flops," Proceedings of the 2000 International Symposium on Low Power Electronics and Design, 2000, pp. 114-119.

(Continued)

*Primary Examiner* — William Hernandez
(74) *Attorney, Agent, or Firm* — Arent Fox, LLP

(57) ABSTRACT

A low clock power data-gated flip-flop is provided. The data-gated flip-flop includes an exclusive OR component including a first exclusive OR input, a second exclusive OR input, and a first exclusive OR output. The first exclusive OR input is configured to receive a data input to the data-gated flip-flop. The data-gated flip-flop includes a first latch including a first latch data input and a first latch reset input, the first exclusive OR output being coupled to the first latch data input and the first latch reset input. The data-gated flip-flop includes a second latch having a data output, the data output coupled to the second exclusive OR input.

26 Claims, 10 Drawing Sheets

(56) References Cited

U.S. PATENT DOCUMENTS

| | | |
|---|---|---|
| 6,275,963 B1 | 8/2001 | Maeno et al. |
| 6,316,301 B1 | 11/2001 | Kant |
| 6,678,846 B1 | 1/2004 | Maeno |
| 7,138,831 B2 | 11/2006 | Tob Ita; Youichi |
| 7,420,391 B2 | 9/2008 | Pesci |
| 7,449,924 B2 | 11/2008 | Vincent |
| 7,590,900 B2 | 9/2009 | Kim et al. |
| 7,649,395 B2 | 1/2010 | Ahmadi |
| 7,652,520 B2 | 1/2010 | Gatta |
| 7,768,315 B2 | 8/2010 | Cheng et al. |
| 7,793,178 B2 | 9/2010 | Sinha et al. |
| 8,339,172 B2 | 12/2012 | Firmin et al. |
| 8,493,119 B2 | 7/2013 | Leach et al. |
| 8,743,251 B2 | 6/2014 | Ui et al. |
| 8,786,344 B2 | 7/2014 | Salling |
| 8,887,015 B2 | 11/2014 | Iwata et al. |
| 9,024,658 B2 | 5/2015 | Shah et al. |
| 9,366,727 B2 | 6/2016 | Gurumurthy |
| 2001/0052096 A1 | 12/2001 | Huijbregts |
| 2002/0070757 A1 | 6/2002 | La Rosa |
| 2002/0194565 A1 | 12/2002 | Arabi |
| 2004/0090279 A1 | 5/2004 | Seki |
| 2007/0143384 A1 | 6/2007 | Muranaka |
| 2010/0308864 A1 | 12/2010 | Lee et al. |
| 2014/0225655 A1* | 8/2014 | Rasouli .......... H03K 5/135 327/161 |
| 2015/0200652 A1* | 7/2015 | Berzins .......... H03K 3/012 327/225 |
| 2017/0117884 A1 | 4/2017 | Ye et al. |

OTHER PUBLICATIONS

Wimer S., et al., "A Look-Ahead Clock Gating Based on Auto-Gated Flip-Flops," IEEE Transactions on Circuits and Systems—I: Regular Papers, May 2014, vol. 61 (5), pp. 1465-1472.

International Search Report and Written Opinion—PCT/US2017/027471—ISA/EPO—dated Jul. 13, 2017.

Strollo A.G.M., et al., "Low-power Flip-flops With Reliable Clock Gating", Microelectronics Journal, Mackintosh Publications Ltd, vol. 32, No. 1, Jan. 1, 2001, XP004219946, ISSN: 0026-2692, DOI: 10.1016/S0026-2692(00)00072-0, pp. 21-28.

* cited by examiner

LOW CLOCK POWER DATA-GATED FLIP-FLOP

BACKGROUND

Field

The present disclosure relates generally to clock-gating cells, and more particularly, to clock-gating cells that may have low area, low power, low setup time, or some combination of these.

Background

A clock-gating cell is a cell that gates a clock in order to reduce dynamic power dissipation in components that receive the clock. By gating the clock, the clock may be turned on and off to components that receive the clock. For components that receive the clock, but are being unutilized in an integrated circuit (IC), one or more clock-gating cells may be used to switch off the clock so as to avoid switching states and consuming power within the unutilized components that receive the clock in the IC. Many clock-gating cells may be used within an IC. Clock-gating cells with low area and/or low power may be advantageous because the area used by the clock-gating cells and/or the power used by the clock-gating cells may be a limited resource. Low setup time for some example flip-flops being gated by the clock gating cells may be advantageous because high setup time may negatively impact functionality in some cases.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method and an apparatus are provided. The apparatus may be a data-gated flip-flop. The data-gated flip-flop includes an exclusive OR component. The exclusive OR component includes a first exclusive OR input, a second exclusive OR input, and a first exclusive OR output. The first exclusive OR input is configured to receive a data input to the data-gated flip-flop. The data-gated flip-flop includes a first latch. The first latch includes a first latch data input and a first latch reset input. The first exclusive OR output is coupled to the first latch data input and the first latch reset input. The data-gated flip-flop includes a second latch. The second latch has a data output. The data output is coupled to the second exclusive OR input.

In another aspect of the disclosure, a method and an apparatus are provided. The apparatus may be a data-gated flip-flop. The data-gated flip-flop includes a clock gating circuit (CGC). The clock gating circuit generates a clock gating signal (pn1). The clock gating signal has a logical value equivalent to: $pn1(next) = (clk \times pn1 + \overline{clk}) \times (\overline{D} \times Q + D \times \overline{Q})$. The data-gated flip-flop includes an output latch. A clock to the output latch is gated by the clock gating signal.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
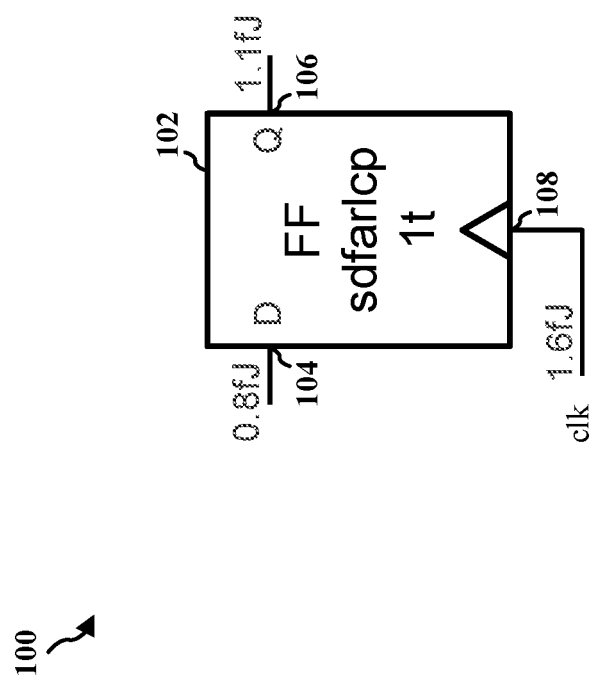
FIG. 1 is a diagram illustrating an example flip-flop.

FIG. 1 is a diagram 100 illustrating an example flip-flop 102. The example flip-flop 102 includes a data input (D) 104, a data output (Q) 106, and a clock input (clk) 108. In one particular example, the dynamic power used by the flip-flop may be 0.8 femtojoules (fJ) at the D input 104, 1.1 fJ at the Q output 106, and 1.6 fJ at the clock input 108. As is illustrated in FIG. 1, in many implementations of the flip-flop 102, the clock input 108 may generally use more power than the other inputs (e.g., the D input 104 and the Q output 106). Additionally, the clock input 108 may use more power than other inputs because an input signal at the clock input 108, e.g., a clock signal, may generally switch more often than other signals, such as the D input 104 and the Q output 106. (The clock input 108 may use dynamic power a higher percentage of the time.) Accordingly, it may be advantageous to limit switching on the clock input 108 to times when the clock signal is needed, i.e., when the data on the D input 104 is different from the data on the Q output 106. When the data is the same, there is no new data to clock in.

More specifically, in some examples, a flip-flop's dynamic power may generally include three predominant components, (1) D input 104 power when the flip-flop 102 clk is held low and output is not switching, (2) clock input 108 toggle power when the flip-flop 102 Q output 106 is not switching, and (3) the flip-flop 102 Q output 106 switching power. (Power may dissipate in the flip-flop 102 related to other circuitry or inputs not illustrated in FIG. 1, or other conditions, however, the three predominant components of dynamic power may generally outweigh the other components of dynamic power in some examples.

The flip-flop 102 of FIG. 1 illustrates typical switching power in energy used per cycle (in fJ per cycle) for an example high usage flip-flop. A tangible number of flip-flops (e.g., or registers) in a system on a chip (SoC) may normally have a low data activity rate. In other words, a number of flip-flops in an SoC may not switch very often. Examples of flip-flops that may normally have low data activity rates include, but are not limited to pipeline registers in low power audio processing units and flip-flops for the most significant bits (MSB) of program counter (PC) registers, to name two examples.

As described herein, in an SoC, a tangible number of registers may have low data activity, for example, the pipeline registers or flip-flops for the MSBs of a PC register. One example SoC may have 10 million bits of flip-flops. Assuming that 2% of the flip-flops (0.2M) have a low data activity rate, e.g. 0.1, for a low data activity rate of 0.1, only 10% of clock cycles will have new data at the input to a flip-flop. Further assume that the flip-flops in the example are operating at 500 MHz with a clock gating ratio of 0.8 (i.e., 80% of the clock cycles are gated). Accordingly, the clock for the flip-flops is only active for 20% of the clock cycles (1.0−0.8=0.2=20%). In the example, however, further assume that only 10% of the clock cycles have new data at the input of a flip-flop. Accordingly, at least 10% of clock cycles do not process any new data (20% active clock, 10% active data, 10% unneeded clock cycles-50% of the active clock cycles). Assuming the gated clock power is ⅓ of active clock power, the clock power savings from converting these flops to data-gated flops for this block may be as follows:

Power Savings=0.2M*10%*500M*2/3*1.6 fJ=10.7 mW.

Figure 2:
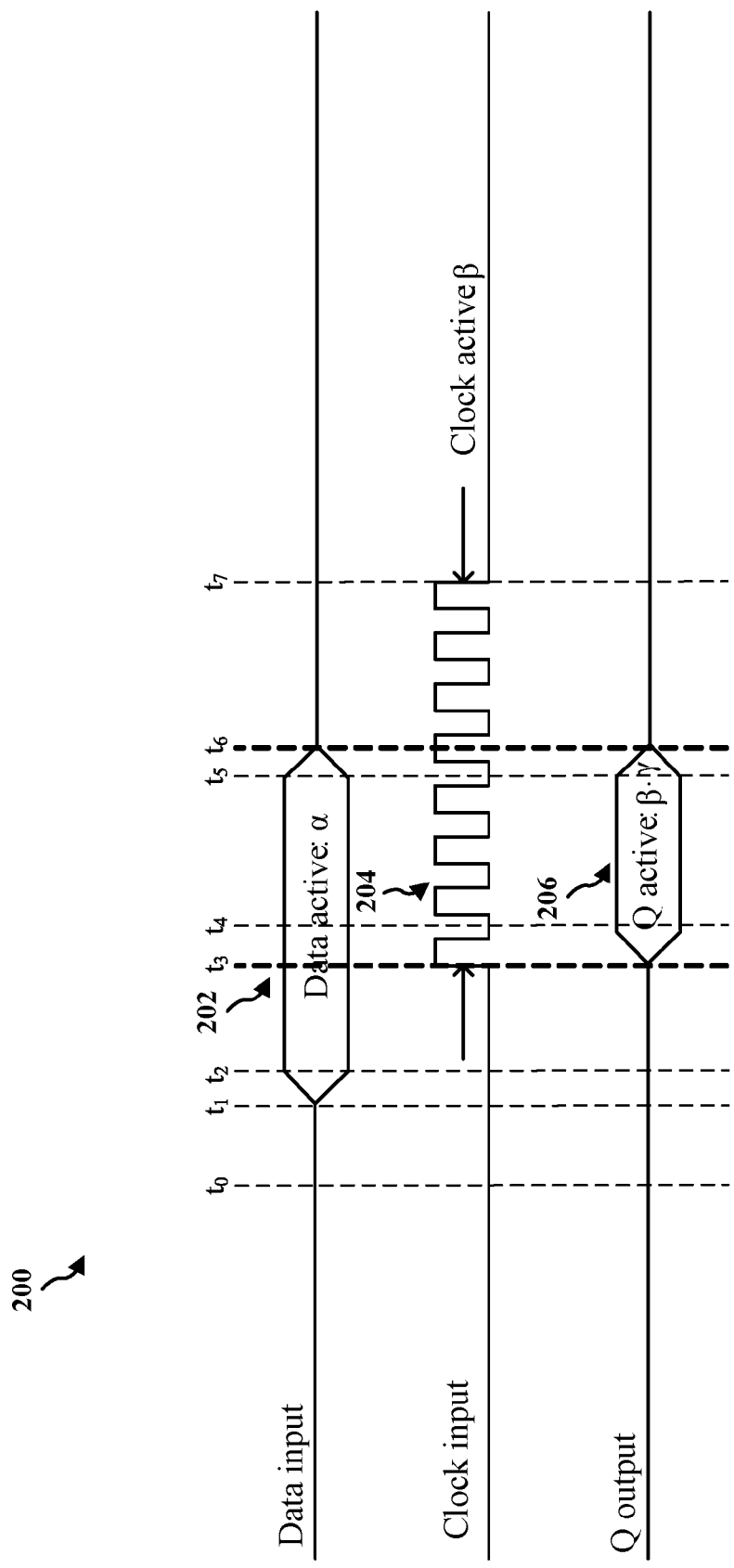
FIG. 2 is a timing diagram for the example flip-flop of FIG. 1.

FIG. 2 is a timing diagram 200 illustrating example timing for the example flip-flop 102 of FIG. 1. The timing diagram 200 illustrates a period 202 when the D input 104 may be active. Additionally, the timing diagram 200 illustrates a period 204 when the clock input 108 may be active. Finally, the timing diagram 200 also illustrates a period 206 when the Q output 106 may be active.

Generally, at a time, t₀, no activity occurs on the D input 104. In some examples, the D input may be in an unknown state before $t_1$. The D input 104 is silent, but may generally either be low or high. In other examples, the D input 104 may be inactive in a high or low state depending on a pervious input to the flip-flop. In other examples, the D input 104 may be in an invalid state, tri-stated, or in some other unknown state before $t_1$. Similarly, the Q output may generally be inactive or silent and either low or high. In other examples, the Q output may be in an invalid state before $t_1$. The clock input may be low. As illustrated in FIG. 2, at a time, $t_1$, the data input may begin to change to a stable value, e.g., a logic high or a logic low value.

At a time, $t_2$, the D input 104 may be stable. For example, the D input 104 may be a low value or the D input 104 may be high value. In systems that include multiple flip-flops such as a series of flip-flops like the flip-flop 102, different inputs to the series of flip-flops (such as the D input 104 of the flip-flop 102) may have different logical states or logical values, e.g., low or high. Accordingly, when the data input on the timing diagram is used to represent an 8-bit data bus, for example, the data inputs may have $2^8$ or 256 different possible combinations. (It will be understood that any valid number of bits from 1 bit to n bits may be used.) The examples described herein are illustrated using 1-bit flip-flops.

Generally, however, between $t_2$ and $t_3$, there may be some activity at the D input 104, e.g., some spurious switching, but the activity is generally inconsequential because there is no clock before $t_3$. Accordingly, the flip-flop 102 is not going to capture the value at the D input 104 between $t_2$ and $t_3$. Generally, before $t_3$, the Q output 106 is silent, either at a low value or a high value. The Q output 106 may generally not be invalid/unknown, rather the Q output 106 may keep the previous valid state until the clock is turned on again.

At a time, $t_3$, the clock input 108, which may be gated during certain periods of time, may begin to oscillate, to begin the period 204 when the clock input 108 is active. (For example, the clock input 108 may no longer be gated at time, $t_3$.) In an example, at the time $t_3$, the circuitry controlling the flip-flop 102 may discontinue gating the clock signal on the clock input 108 of the flip-flop 102. Accordingly, on the rising edge of a clock signal on the clock input 108 of the flip-flop 102 (or after some small delay through the flip-flop 102, not illustrated in FIG. 2), the Q output 106 of the flip-flop 102 may begin to change. At a time, $t_4$, generally prior to the next rising edge of the clock on the clock input 108 of the flip-flop 102, the Q output 106 of the flip-flop 102 may stabilize as illustrated in FIG. 2.

Generally, as illustrated in FIG. 2, the clock input 108 of the flip-flop 102 may be positive clock edge sensitive. For example, the clock signal on the clock input 108 may clock data into the flip-flop 102 on the rising edge of the clock signal. The clock input 108 may, however, be negative clock edge sensitive, in other examples. Accordingly, in some examples, the D input 104 may be read into the flip-flop and the Q output 106 may change based on the rising edge, or the falling edge of the clock signal on the clock input 108 of the flip-flop 102.

At a time $t_5$, the data on the D input 104 of the flip-flop 102 (and possibly other data inputs on other flip-flops) may no longer be active (receiving new data) as illustrated in FIG. 2. Similarly, the data on the Q output 106 of the flip-flop 102 may no longer be active (producing new data) when the data on the input is no longer switching at the time, $t_6$.

At a time, $t_7$, after the data on the D input 104 of the flip-flop 102 may be inactive and after the data on the Q output 106 has been inactive for some period, e.g., $t_7$-$t_6$, the clock signal on the clock input 108 may discontinue oscillating. When the D input 104 of the flip-flop 102 is inactive or the Q output 106 of the flip-flop 102 is inactive for some period of time, e.g., $t_7$-$t_6$, the clock signal on the clock input 108 may be gated. In other words, the clock signal on the clock input 108 of the flip-flop 102 may be gated during times when the D input 104 to the flip-flop 102 does not change. Gaiting the clock input 108 of the flip-flop 102 may conserve power used by the flip-flop 102. Some examples described herein may decrease or eliminate the delay, $t_7$-$t_6$ so that the clock signal is only active when data on the D input 104 is different from the data on the Q output 106.

As illustrated in FIG. 2, the clock signal might only be active when data on the D input 104 is valid (and perhaps for short periods before the data is valid, short periods after the data is valid, or both). Some examples of the systems and methods described herein may minimize the short periods before the data is valid, short periods after the data is valid, or both.

Referring to FIG. 2, in an example, data needs to be valid as long as the clock input is toggling, e.g., approximately $t_3$ to approximately $t_7$. As described above, data may be active or silent regardless of whether it is valid or not valid. Generally, for a flip-flop 102, Q may be valid during the entire period illustrated in FIG. 2. (The Q value is generally held until a new value is clocked into the flip-flop 102.) Some examples described herein may reduce internal clock activity and, accordingly, reduce internal clock power consumption, when an external clock (the clock input) is toggling but there is no data activity, e.g., from $t_6$ to $t_7$.

Additionally, it will be understood, that there may be a delay from when data is determined to be valid or changing and when the clock signal on the clock input 108 begins to oscillate or discontinues osculating. There may be some delay from when the signal on the data input stops changing, the signal on the data input is based on a previous value, e.g., high or low, invalid, the signal on the data input is tri-stated, or the signal on the data input is otherwise in a state that does not require that the flip-flop 102 be clocked. Some examples of the systems and methods described herein may minimize the delay.

In some examples, the clock signal on the clock input 108 of the flip-flop 102 may begin oscillating when data on the D input 104 is different from data on the Q output 106. FIG. 2 illustrates a delay from the time $t_2$ and when the clock signal on the clock input 108 begins to oscillate, i.e., $t_3$. The systems and methods described herein may, in some examples, minimize the delay, $t_3$-$t_2$.

Similarly, in some examples, the clock on the clock input 108 of the flip-flop 102 may stop oscillating when the data on the D input 104 is the same as the data on the Q output 106. There may be a delay from the determination of when the data on the D input 104 is the same as the data on the Q output 106, however. For example, FIG. 2 illustrates a delay from the time $t_6$ to when the clock signal on the clock input 108 stops oscillating, $t_7$, e.g., $t_7$-$t_6$. The systems and methods described herein may reduce the delay, $t_7$-$t_6$.

The following terms may be defined. The data activity rate, α, is the probability of data toggle for each clock cycle. The clock activity rate, β, is the probability of clock pin toggle for each clock cycle. The clock gating efficiency, γ, is the probability of D-pin having new data when clock pin toggles. A conditional probability may be defined as: γ=P (data-active|clock-active). The probability of output Q switching for each clock cycle is equal to: β·γ.

Figure 3:
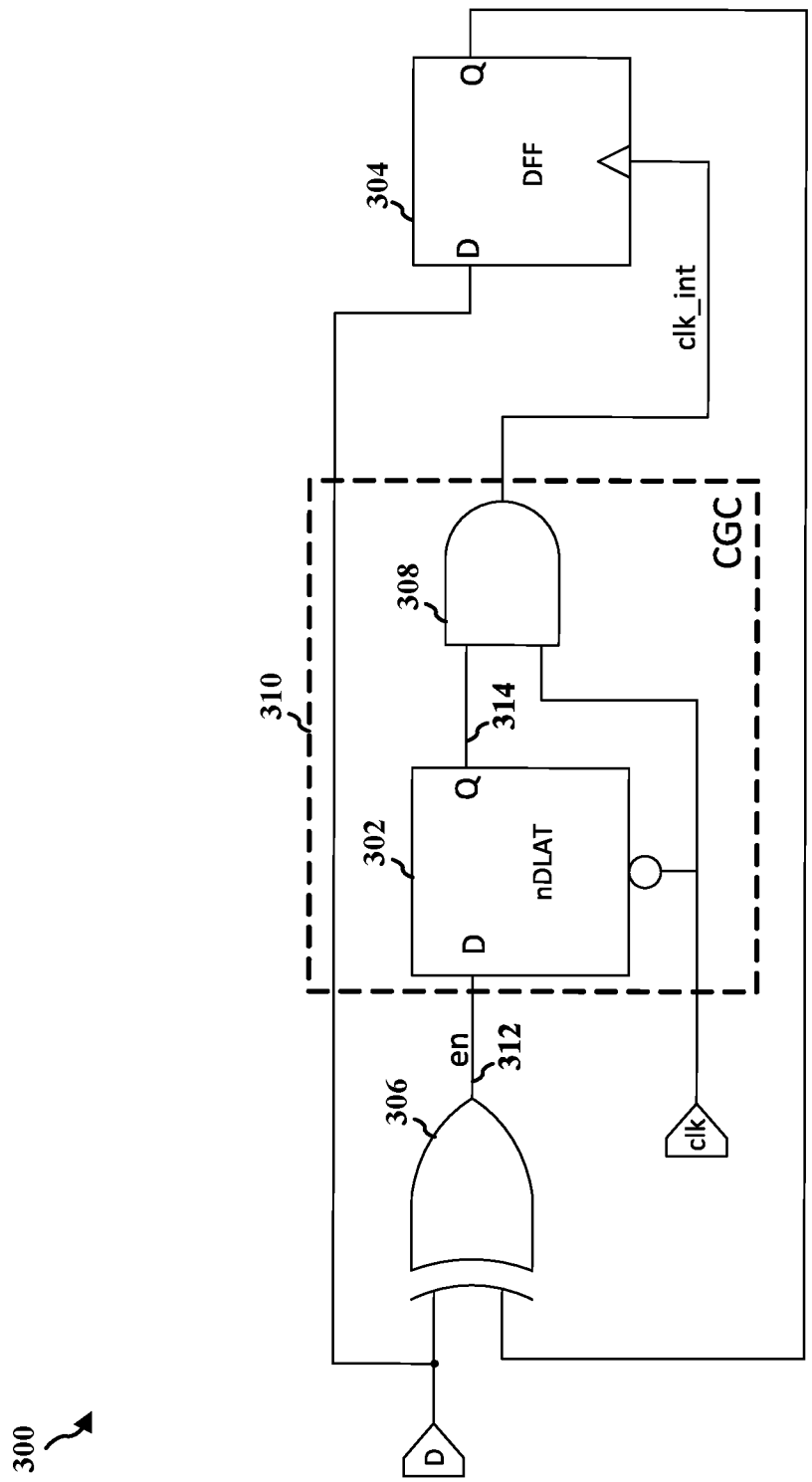
FIG. 3 is a diagram illustrating an example flip-flop.

FIG. 3 illustrates an example clock gated D flip-flop 300. The example clock gated D flip-flop 300 may include a D latch 302 and an internal D flip-flop 304. As illustrated in FIG. 3, the clock gated D flip-flop 300 may also include an exclusive OR gate 306 and an AND gate 308. The internal clock signal (clk_int) that is clocking the internal D flip-flop 304 may be gated by the AND gate 308. Accordingly, the D latch 302 and the AND gate 308 may be referred to as a clock-gating cell clock gating cell (CGC) 310. The CGC 310 may gate the clock when the D input of the clock gated D flip-flop 300 is equal to the Q output of the gated D flip-flop. Conversely, the CGC 310 may allow the clock to pass when the D input of the clock gated D flip-flop 300 is not equal to the Q output of the gated D flip-flop 300.

For example, the Q output of the clock gated D flip-flop 300 (which is also the Q output of the internal D flip-flop 304) may be exclusive ORed with the D input to the clock gated D flip-flop 300 to determine if the Q output of the clock gated D flip-flop 300 is the same as or different from the D input of the clock gated D flip-flop 300. The output of the exclusive OR gate 306 is only high if the Q output of the clock gated D flip-flop 300 and the D input to the clock gated D flip-flop 300 are different. When the Q output of the internal D flip-flop 304 (which may be considered the output of the clock gated D flip-flop 300) and the D input to the clock gated D flip-flop 300 are different, the output of the exclusive OR gate is high. When the Q output of the internal D flip-flop 304 (which may be considered the output of the clock gated D flip-flop 300) and the D input to the clock gated D flip-flop 300 are the same, the output of the exclusive OR gate is low.

When the D input to the clock gated D flip-flop 300, and the output of the clock gated D flip-flop 300 (e.g., the internal D flip-flop 304) are different, the output 312 of the exclusive OR gate 306 is high. The output 312 of the exclusive OR gate 306 is an enable signal (en). The enable signal may be latched into the D latch 302 once the clock signal (clk) is high. When the enable signal, which is an input to the D latch 302, is latched into the D latch 302, the value on the input to the D latch 302 is stored in the D latch 302. The value in the D latch 302 is not affected by the input to the latch until the next time latch 302 is active. (The D latch 302 may be level sensitive and active low.) The output (at 314) of the D latch 302 may be ANDed together with the clock signal using the AND gate 308. Accordingly, the AND gate 308 may gate the clock signal (clk) into the internal D flip-flop 304 of the clock gated D flip-flop 300 to generate the internal clock, clk_int signal. Thus, the clk_int signal may only change when the clock enable signal, (en), i.e., output 312, is active and has been latched into the D latch 302. Thus, the clk_int signal may only change when the AND gate 308 input (at 314) is high.

At chip-level, on average, the data and clock activity rate may be in 15~20% range. At a flip-flop, based on an example design's clock-gating algorithm, the clock-gating efficiency γ may vary. A low γ indicates high free-running clock activity without processing any new data. To improve γ, extra logic may be used to generate clock-gating signals that require additional area and power overhead. For the example of FIG. 3, when D=Q, en=0; clk_int is gated to 0, and the flip-flop internal clock is not toggling. When D≠Q, en=1; when clk rises, clk_int will rise and let D=>Q. The example of FIG. 3 may have a significant area and power overhead from the CGC 310 and exclusive OR gate 306. Initial (native) γ has to be low enough (<0.2) to make this approach attractive if data-gating logic is built from standalone standard cells.

Figure 4:
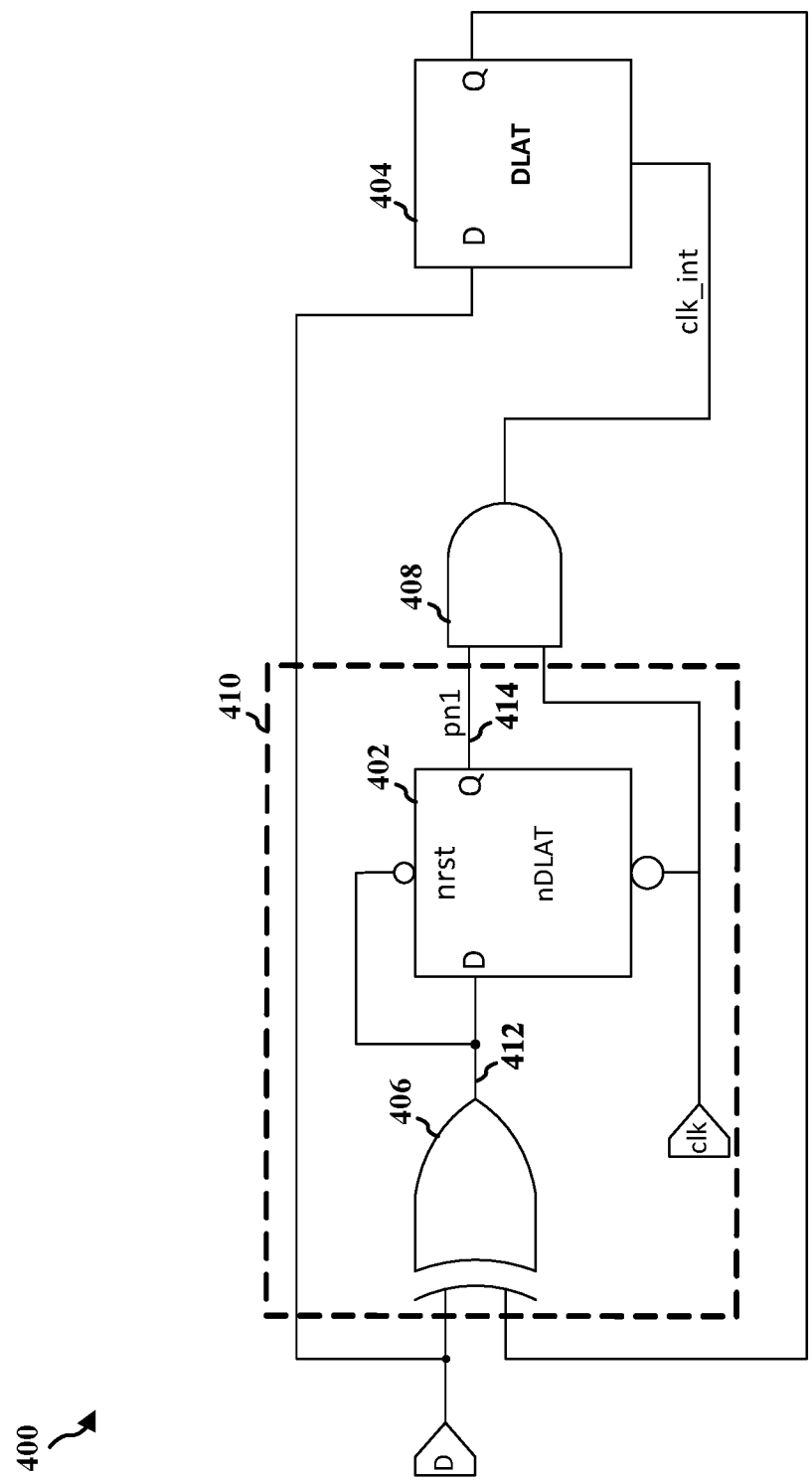
FIG. 4 is a diagram illustrating an example flip-flop in accordance with the systems and methods described herein.

FIG. 4 is a diagram illustrating an example clock gated D flip-flop 400 in accordance with the systems and methods described herein. The example clock gated D flip-flop 400 includes a D latch 402 and a D latch 404 (rather than a flip-flop). Similar to the discussion of FIG. 3, the clock gated D flip-flop 400 includes an exclusive OR gate 406 and an AND gate 408. The D latch 402 illustrated in FIG. 4 may be asynchronously reset, however. For example, the D latch 402 may be held reset when the output of the clock gated D flip-flop 400 and the D input to the clock gated D flip-flop 400 are equal. When the Q output of the clock gated D flip-flop 400 and the D input to the clock gated D flip-flop 400 are equal, the output 412 of the exclusive OR gate 406 will be low. When the Q output of the clock gated D flip-flop 400, and the D input of the clock gated D flip-flop 400 are not equal, the Q output of the exclusive OR gate 406 will be high. The D latch 402 is not held reset when the input to the clock gated D flip-flop 400 is different from the output of the clock gated D flip-flop 400 (in the example of FIG. 4) because the reset signal is active low. Accordingly, the output of the exclusive OR gate 406, here a logical high value, "1," may be written into the D latch 402 when the clock signal is a logical low value "0."

Conversely, when the output of the clock gated D flip-flop 400, and the input of the clock gated D flip-flop 400 are the same, the output of the exclusive OR gate 406 will be low. When the output of the exclusive OR gate 406 is low, the D latch 402 may be held reset. Further, as discussed above, the reset of the D latch 402 may be an asynchronous reset.

Latches are typically level sensitive devices. Accordingly, the D latch 402 illustrated in FIG. 4 may be active when the clock signal is low. When the D input and the Q output of the clock gated D flip-flop 400 are not the same, the exclusive OR gate 406 output will be high and the output of the exclusive OR gate 406 will be written into the D latch 402. The output Q of the D latch 402 may be high when the clock is low and the output of the exclusive OR gate 406 is high. Accordingly, the clock input of the D latch 404, clk_int, may be active whenever the output of the clock gated D flip-flop 400 and the input to the clock gated D flip-flop 400 are different. During some periods of time when the D input and the Q output of the clock gated D flip-flop 400 are the same, clocking the clock gated D flip-flop 400 may generally be unnecessary. Accordingly, only clocking the clock gated D flip-flop 400 when the output of the flip-flop and the input of the flip-flop are different may be used to decrease the electrical power used in devices implementing the systems and methods described herein. The clock gated D flip-flop 400 may be further optimized, as described below with respect to FIGS. 5-9.

Figure 5:
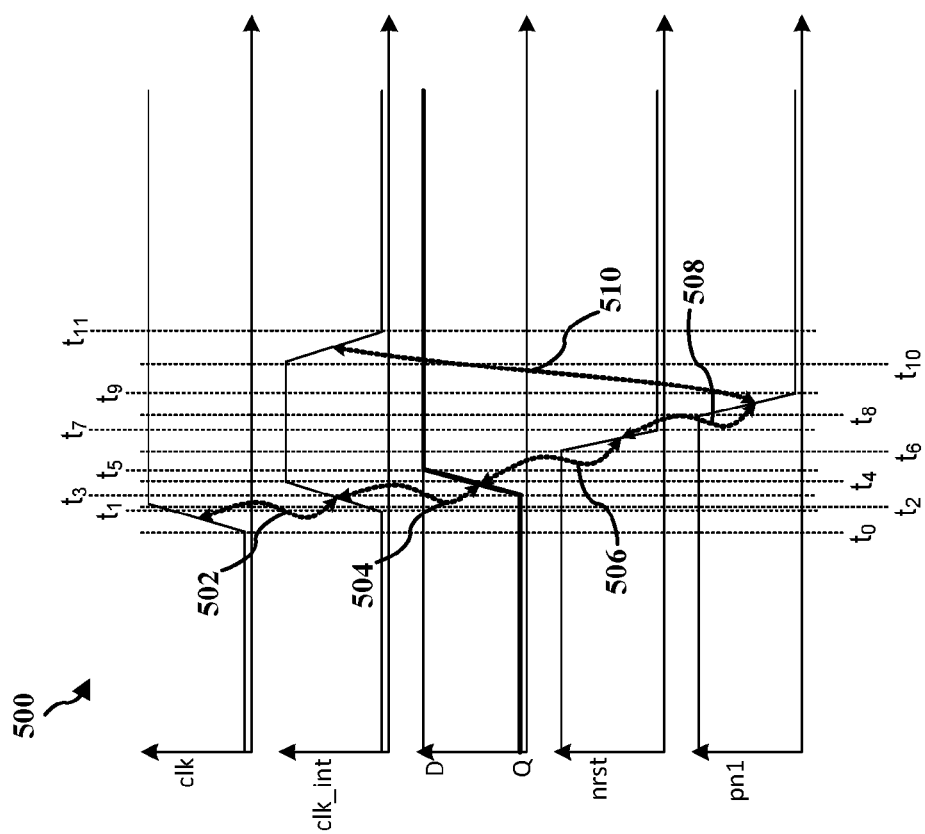
FIG. 5 is a timing diagram for the example flip-flop of FIG. 4.

FIG. 5 is a timing diagram 500 illustrating the functioning of the clock gated D flip-flop 400 illustrated in FIG. 4. At a time before time $t_0$, the clock input, clk, to the clock gated D flip-flop 400 is low as illustrated in the timing diagram 500. Because the clock is low, the internal clock (clk_int), the output of the AND gate 408, is also low, as illustrated in the timing diagram 500.

For the example illustrated in the timing diagram 500, assume that the initial value of the D input of the clock gated D flip-flop 400 is high. Additionally, assume that the output of the clock gated D flip-flop 400 is initially low. Assuming that the clock gated D flip-flop 400 is functioning correctly, it may also be assumed that the input of the clock gated D flip-flop 400 was low at the previous rising clock edge (not illustrated in the timing diagram 500) because the Q output on the timing diagram is initially low before the clock edge at time, $t_0$.

The output 412 of the exclusive OR gate 406 is initially high because the D input to the clock gated D flip-flop 400 is different from the Q output of the clock gated D flip-flop 400. Accordingly, the active low reset, nrst, is also high, i.e., the D latch 402 is not being held reset. Accordingly, the output 414 (pn1) of the D latch 402 may be high (because it is not being held reset) and the D input is high.

The D latch 402 may be level sensitive and active low. Accordingly, the output 414 of the D latch 402, pn1, is high at the time to because the input, D, of the D latch 402 is high and the clock signal is low. Furthermore, with the clk_int signal is low. The clock to the D latch 404 is not enabled and the D latch 404 holds the last value, e.g., a low value. At the time, to, the clock signal, clk, begins to rise from a logic low value to a logic high value.

As indicated by the arrow 502, at the time, $t_1$, as the internal clock signal, clk_int, begins to rise. The pn1 signal is already high. As the clock signal clk_int, rises, the input 414 (pn1) of the AND gate 408 remains high.

The clk signal is high at the time $t_2$. At the time $t_3$, the Q output of the D flip-flop 400 (which is also the Q output of the D latch 404) begins to rise because the D input of the D latch 404 is high and the clk_int signal is rising. (The D input of the D latch 404 is high and the D latch 404 passes the data when the clk_int signal is high.)

At the time $t_4$, the clk_int signal is high. As indicated by the arrow 504, at the time $t_5$, the Q output of the clock gated D flip-flop 400 is high based on the rising edge of the clk_int signal clocking the data into the latch 404.

At the time $t_6$, the active low reset signal, nrst, for the D latch 402 (which is also the D input to the clock gated D flip-flop 400) begins to drop because the Q output of the clock gated D flip-flop 400 is high, and the D input of the D flip-flop is also high. With both of the inputs to the exclusive OR gate 406 high, the output of the exclusive OR gate 406 will be a logical low. Accordingly the output of the exclusive OR gate 406 begins to drop, typically after some delay, e.g. at a time $t_6$. As indicated by the arrow 506, nrst begins to drop based on the rising edge of the Q output of the clock gated D flip-flop 400 (which leads to the match between the Q output and the D input). The output of the exclusive OR gate 406 reaches a low value at the time, $t_7$. Accordingly, the input to the D latch 402 is low and the reset input of the D latch 402 is also low at the time $t_7$.

At the time $t_8$, the output 414 (pn1) of the D latch 402 begins to drop. As indicated by the arrow 508, the active low reset signal, rst, resets the pn1 signal, which is an output of the D latch 402. Accordingly, the output 414 (pn1) may be low at the time $t_9$.

At the time $t_{10}$, the clk_int signal will drop based on the drop of the Q output 414 (pn1) of the D latch 402, as indicated by the arrow 510. At the time $t_{11}$, the clk_int signal has transitioned from a high value to a low value.

Figure 6:
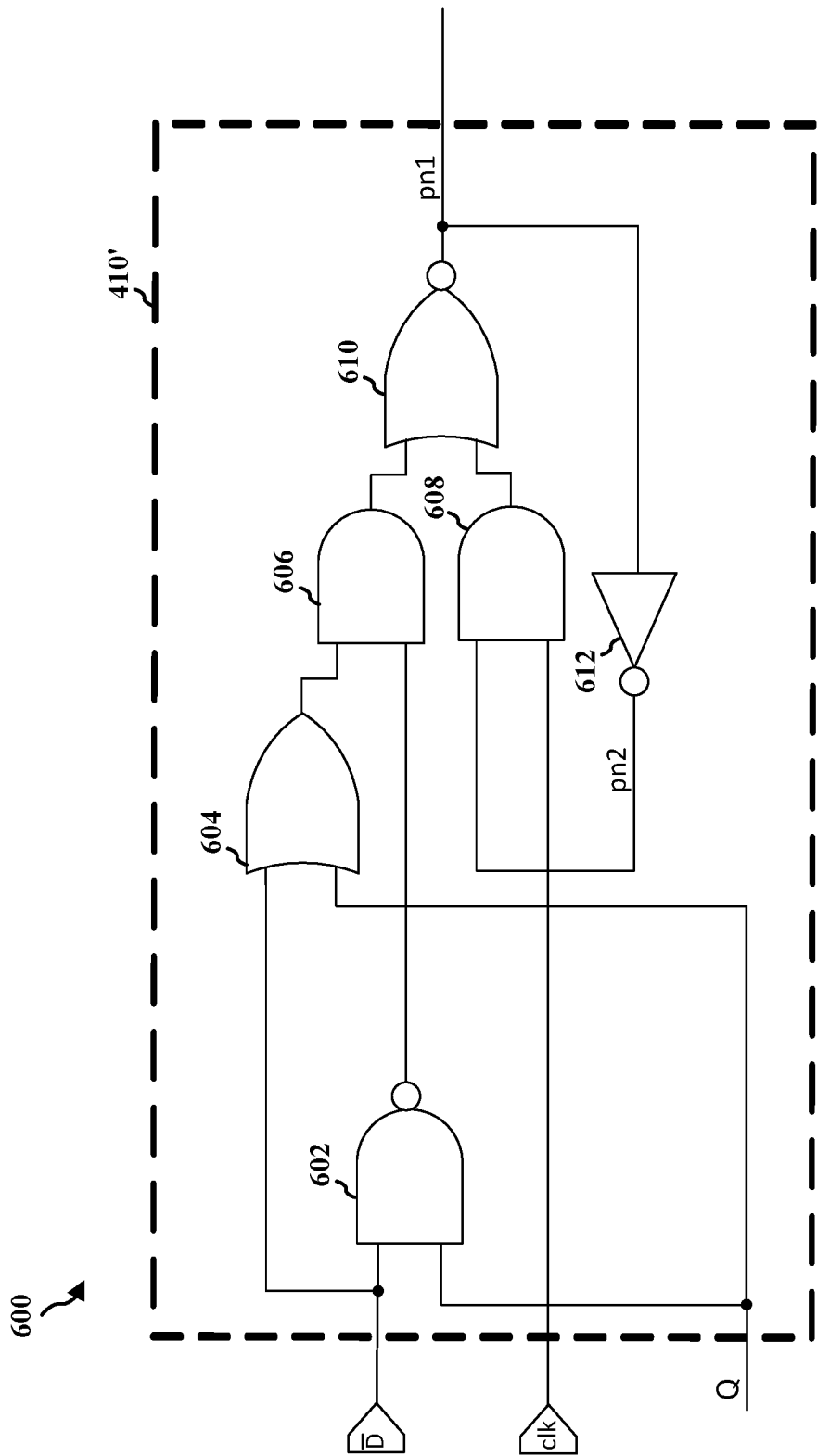
FIG. 6 is a diagram illustrating another example flip-flop in accordance with the systems and methods described herein.

FIG. 6 is a circuit diagram 600 illustrating one example of digital logic circuitry 410' that may be used to implement the pn1 logic 410 of the D latch 402 illustrated in FIG. 4. (The pn1 logic 410 of the D latch 402 and the digital logic circuitry 410' are slightly different, as described below.)

The logic function implementing the exclusive OR gate 406 and the D latch 402 of FIG. 4 may be simplified using a Karnaugh map as illustrated in TABLE 1, below.

TABLE 1

|  | D/Q | | | |
|---|---|---|---|---|
| clk/pn1 | 00 | 01 | 11 | 10 |
| 00 | 0 | 1 | 0 | 1 |
| 01 | 0 | 1 | 0 | 1 |
| 11 | 0 | 1 | 0 | 1 |
| 10 | 0 | 0 | 0 | 0 |

From the Karnaugh map, it may be seen that the two-input exclusive OR gate 406 and the D latch 402 with asynchronous reset may be optimized to reduce device count to the following equation:

$$pn1(\text{next}) = (\text{clk}*pn1 + !\text{clk}) * (!D*Q + D*!Q) = (pn1 + !\text{clk}) \\ * (!D*Q + D*!Q)$$

As illustrated in FIG. 6, the equation may be implementation with a two-input NAND gate 602, and an OR-AND-OR-Inverter (OAOI) structure, i.e., an OR gate 604, AND gates 606, 608, and NOR gate 610 (the NOR gate 610 being used for the OR-Inverter portion of the OAOI structure). Feedback may be provided by an additional inverter 612.

The NAND gate 602, the OR gate 604, the AND gates 606, 608, the NOR gate 610, and the inverter 612 generally implement the simplified equation for pn1. Note, however that the equation for pn1 is a function of the inverse of the D input. For the digital logic circuitry 410' to be equivalent to the pn1 logic 410 of the D latch 402, an additional inverter is needed before the NAND gate 602 on the inverse D input. In the examples that follow in FIGS. 7-9, however, the inversion is performed by a NAND gate 704 within certain input circuitry that is described below with respect to FIGS. 7-9. The NAND gate 602 may have as an input the inverse of the D input. The NAND gate may have as an input the Q output (or pn4, which is generally a version of the Q output, as discussed with respect to FIGS. 7-8).

Figure 7:
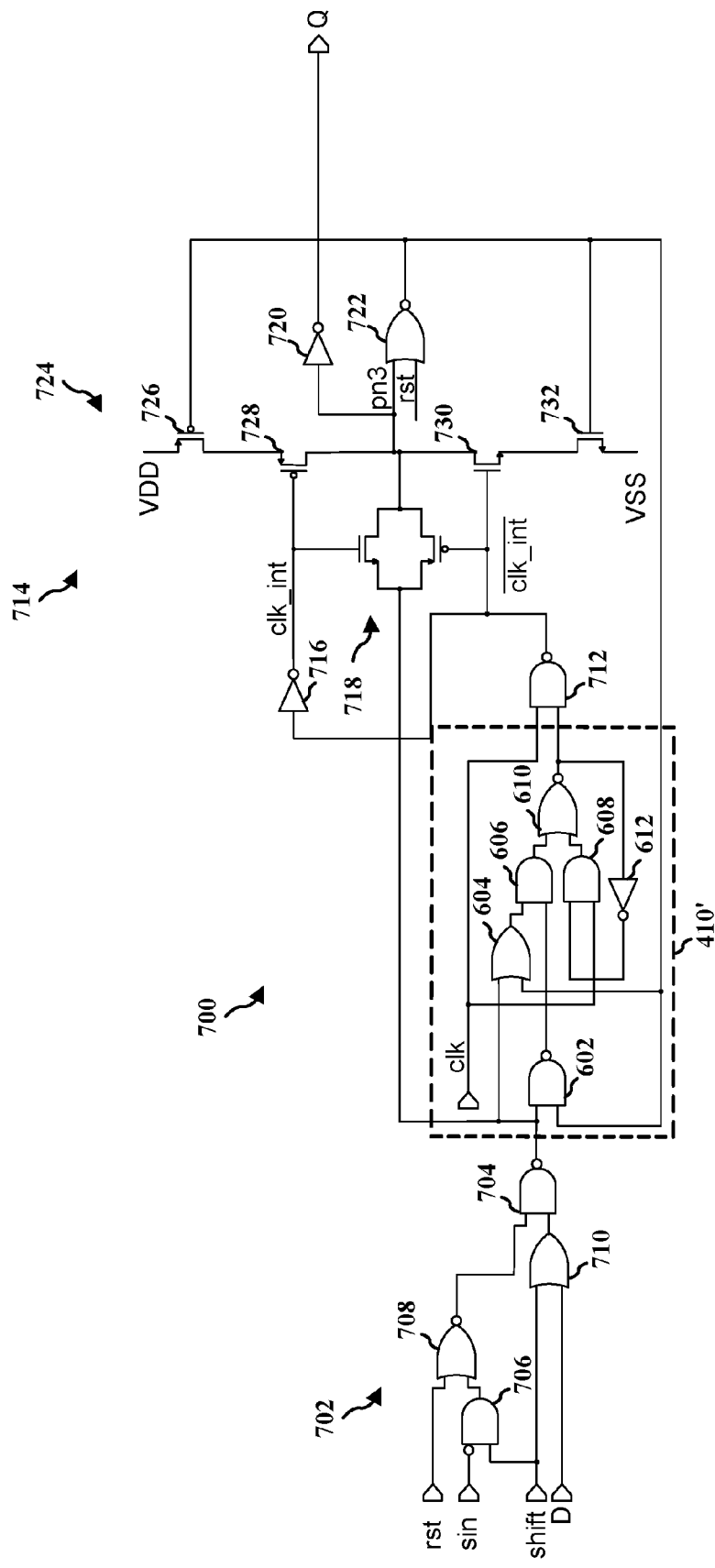
FIG. 7 is a diagram illustrating another example flip-flop in accordance with the systems and methods described herein.

FIG. 7 is a circuit implementing a clock gated D flip-flop 700 design according to the systems and methods described herein. The clock gated D flip-flop 700 includes optimized circuitry for the pn1 logic, i.e., digital logic circuitry 410' illustrated in FIG. 6. As discussed above, the optimized circuitry for the pn1 logic, i.e., digital logic circuitry 410', does not include an inverter. The inversion function is performed in the input circuitry 702. More specifically, the inversion function is performed by the NAND gate 704.

The clock gated D flip-flop 700 provides a flip-flop with a transistor count of 50 with only four clock toggling devices when the D input of the clock gated D flip-flop 700 is equal to the Q output of the lip-flop. While having similar performance based on the D input setup time and the clock to Q output performance for other flip-flop designs. The clock gated D flip-flop 700 may be implemented in very compact layout because of fewer cross-couple connections used in the design. The data hold-time for the clock gated D flip-flop 700 may be higher than previous flip-flop designs, however.

FIG. 7 includes input circuitry 702. The input circuitry 702 includes an AND gate 706 (having one inverted input), a NOR gate 708, an OR gate 710, and the NAND gate at 704 discussed above. (The AOI circuitry, AND gate 706 and NOR gate 708, may be replaced by a two-input NAND gate if the reset functionality is not needed.)

The input circuitry 702 generates an inverted version of the D input when the shift signal is low and the reset signal (rst) is low. In other words, the output of the input circuitry 702, i.e., the output of the NAND gate 704, is the inverse of the D input when the shift signal is low and the reset signal is low. (The D input is one of the inputs to the OR gate 710.) When the reset signal is high, the output of the input circuitry 702, i.e., the output of the NAND gate 704, is always low. When the shift signal is high, and the reset signal is low, the output of the input circuitry 702 (the output of the NAND gate 704) is the inverse of the shift in (sin) signal.

The input circuitry 702 may generally perform a similar function to a multiplexer circuit that also includes an inverter and a NAND gate. Accordingly, in another example, the input circuitry 702 may be replaced by a multiplexer, an inverter, and a two-input NAND gate (not illustrated). The multiplexer selects between the D input and the sin signal. (The sin signal is inverted at the input to the AND gate 706.) The shift signal performs the selection on the multiplexer between the D input and the sin signal. (Assuming shift is active high, the D input may be on the "0" input and the sin signal may be on the "1" input.) The output of the multiplexer may be connected to an input of the two-input NAND gate. The reset signal may be connected to the other input of the two-input NAND gate through the inverter. The two-input NAND gate may connect to the rest of the clock gated D flip-flop 700 in place of the NAND gate 704. This multiplexer circuitry may also be used in place of the input circuitry 702 described with respect to the clock gated D flip-flops 800, 900. For flip-flops without the reset functionality, an inverting multiplexer (or a multiplexer and an inverter) may be used in place of the reset inverter and the NAND gate.

As described above, the digital logic circuitry 410' illustrated in FIG. 7 generally implements the exclusive OR gate 406 of FIG. 4 and the D latch 402 of FIG. 4 (with the needed inversion performed by the input circuitry, e.g., the NAND gate 704).

The NAND gate 712 provides the clock gating function that gates the clock to the second latch 714. The second latch 714 is generally similar to the D latch 404 illustrated in FIG. 4. The NAND gate 712 generally performs the same function as the AND gate 408 of FIG. 4, however, the NAND gate 712 provides an inverted version, to invert the clock signal, clk_int. The inverted version of the clock is then inverted by the inverter 716, which provides the clk_int signal.

A pair of transistors forms a transmission gate 718. The transmission gate 718 passes the inverted version of the input (or the inverted version of the shift in signal, or the reset signal) when the clock signal, clk_int is high. The inverted version of the input, D, is inverted by the inverter 720 to provide the Q output of the clock gated D flip-flop 700. The Q output of the clock gated D flip-flop 700 is generally similar to the Q output of the D latch 404 of FIG. 4. However, in the illustrated example of FIG. 7, the Q output of the clock gated D flip-flop 700 (the output of the inverter 720) is not used for feedback to the flip-flop circuit. Rather, the NOR gate 722 provides feedback to the input of the digital logic circuitry 410'. The NOR gate 722 may also feed the reset signal back to the input of the pn1 circuitry, i.e., the digital logic circuitry 410'. (If the reset functionality is not needed, the NOR gate 722 may be replaced by an inverter.) Additionally, the output of the NOR gate 722 may control the transistor circuit 724, which includes transistors 726, 728, 730, 732. The output of the NOR gate 722, which generally follows the Q output of the clock gated D flip-flop 700 (when the reset signal is not active) controls the transistors 726, 732. The transistors 728, 730 are controlled by the !clk_int and the clk_int signals respectively. When the clk_int signal is high, and the !clk_int signal is low, the transmission gate 718 is active and the transistor circuit 724 is not active. Accordingly, the transistors 728 and 730 are off. When the clk_int signal is low, and the !clk_int signal is high, the transistor circuit 724 holds a value at the inputs to the inverter 720. For example, if the output of the NOR gate 722 is low, which implies that the pn3 input to the NOR gate 722 is high (assuming that reset is low), the output of the NOR gate 722 will turn on the transistor 726. Additionally, the transistors 728 will be on because the clk_int signal is also low.

Similarly, if the output of the NOR gate 722 is high, which implies that the pn3 input to the NOR gate 722 is low, the output of the NOR gate 722 will turn on the transistor 732. The transistors 730 is on because the !clk_int signal is high. Accordingly, the pn3 input of the NOR gate 722 is held low through the transistors 730, 732. The transistor circuit 724 holds the previously clocked in value to the second latch 714.

The inverted data that goes to the transmission gate 718 may then be held by the transistor circuit 724 after the transmission gate 718. The inverter 720 provides the Q output by inverting the inverted D input value provided to the digital logic circuitry 410'. The NOR gate 722 provides a feedback loop.

Figure 8:
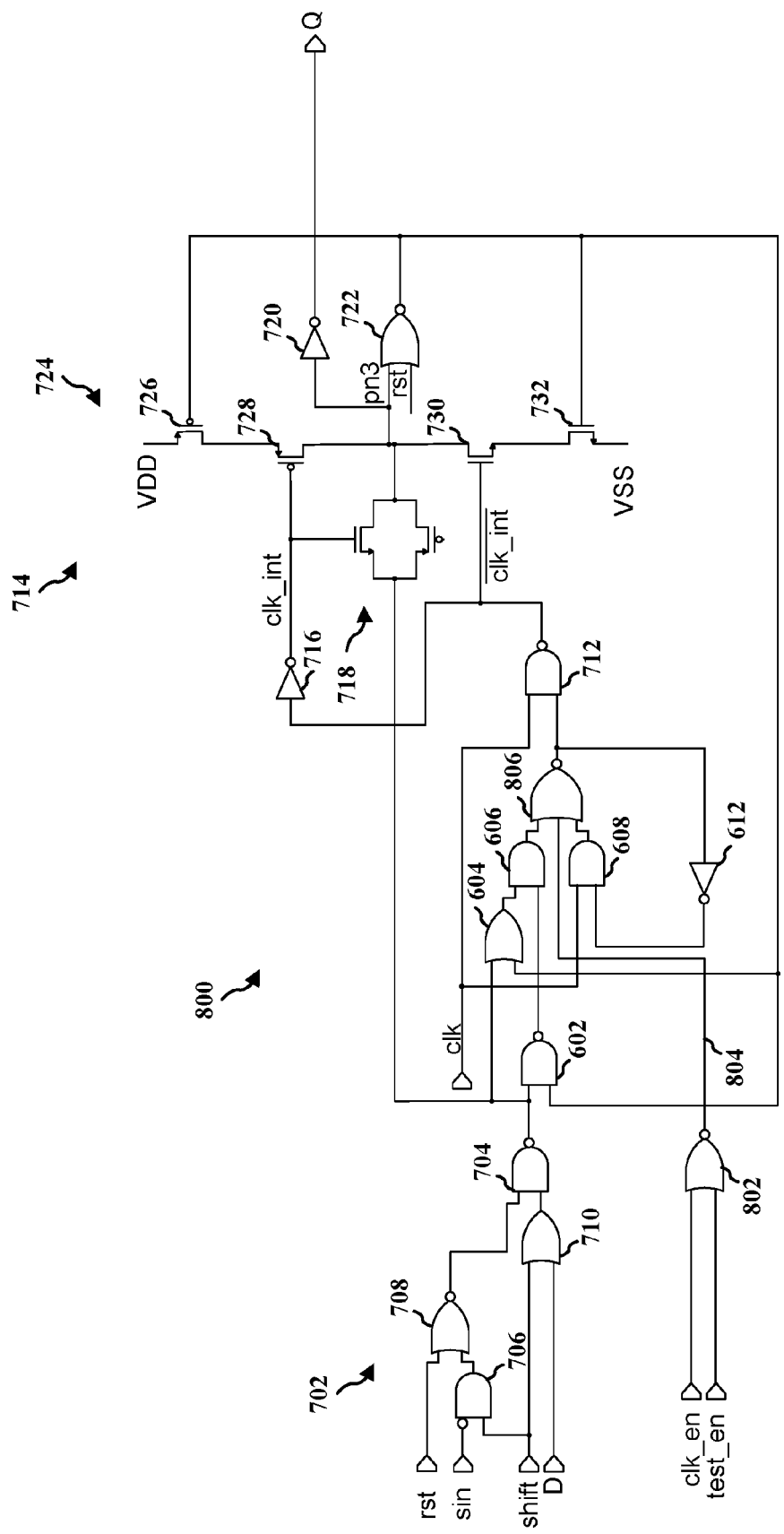
FIG. 8 is a diagram illustrating another example flip-flop in accordance with the systems and methods described herein.

FIG. 8 is a circuit diagram of a clock gated D flip-flop 800 according to the systems and methods described herein. The clock gated D flip-flop 800 is generally similar to the clock gated D flip-flop 700 illustrated in FIG. 7. The clock gated D flip-flop 800, however, includes a clock enable (clk_en) function and a test enable (tst_en) function, however. The clock gated D flip-flop 800 may provide a tangible area savings and active power savings (e.g., when clk_en=1) as compared to a discrete standard cell design driving a single bit flip-flop.

The clock enable signal and the test enable signal may be combined using a NOR gate 802. The output (at 804) of the NOR gate 802 may be an input to a three-input NOR gate 806. The three input NOR gate generally performs the same function as the NOR gate 610, however, the third input provides for the clock enable signal functionality and the test enable functionality.

As described, the clk_en signal and the tst_en signal may be added to the circuit using the two input NOR gate 802 and routing the output of the NOR gate 802 to an input of the three-input NOR gate 806. When both the clk_en signal and the tst_en signal are low, the output of the NOR gate 802 is high. Accordingly, when the clock enable signal and a test enable signal are low, the output of the three-input NOR gate 806 will always be low because the input (at 804) is high. With the output of the three-input NOR gate 806 always low when the clock enable and a test enable are low, the clock gated D flip-flop 800 is not enabled.

When either clock enable or test enable are high (or both) then the output of the NOR gate 802 is low. When the output of the NOR gate 802 is low (meaning that the clock enable and/or the test enable are active) the three-input NOR gate 806 will generally function similar to the NOR gate 610 illustrated in FIG. 6, as described above. The input circuitry 702 and the second latch 714 illustrated in FIG. 8 generally function similarly to the input circuitry 702 and the second latch 714 illustrated in FIG. 7 and described above with respect to FIG. 7.

Figure 9:
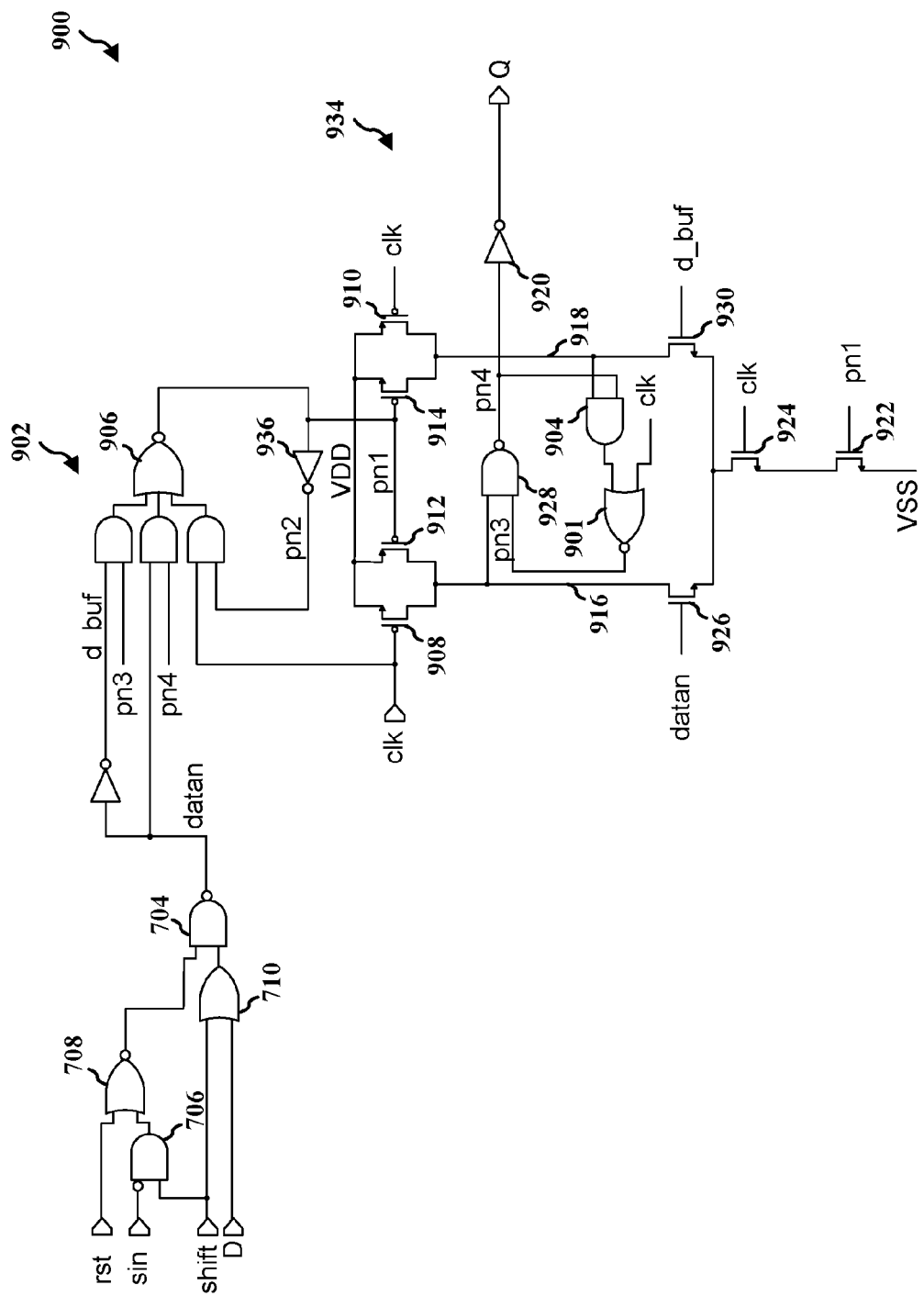
FIG. 9 is a diagram illustrating another example flip-flop in accordance with the systems and methods described herein.

FIG. 9 is a diagram illustrating a clock gated D flip-flop 900. The clock gated D flip-flop 900 includes input circuitry 702. The input circuitry 702 illustrated in FIG. 9 functions generally similarly to the input circuitry 702 illustrated in FIGS. 7 and 8. Accordingly, the AND gate 710 and the NOR gate 708 may be replaced with a two-input NAND gate if reset functionality is not needed. Similarly, the NOR gate 901 and the AND gate 904 may be replaced with a two-input NAND gate if reset functionality is not needed.

The clock gated D flip-flop 900 may provide a low data hold-time topology, e.g., as compared to the clock gated D flip-flop 700 of FIG. 7. The clock gated D flip-flop 900 may be implemented with 52 transistors and may have only five clock toggling devices when the D input to the clock gated D flip-flop 900 is equal to the Q output of the clock gated D flip-flop 900. The clock gated D flip-flop 900 may have similar performance to other flip-flop designs with respect to setup time and clock to output time.

The clock gated D flip-flops 700, 800 of FIGS. 7-8 feed the output of the NOR gate 722 back to the NAND gate 602 to gate the clock on the second latch 714. In some examples, feeding the output of the NOR gate 722 back to the NAND gate 602 to gate the clock on the second latch 714 of FIGS. 7-8 may increase hold time. The clock gated D flip-flop 900 may provide a low data hold-time topology, which may have a lower hold time when compared to the clock gated D flip-flops 700, 800.

The output of the input circuitry 702 illustrated in FIG. 9, i.e., the datan signal may generally be an inverted version of the D input, an inverted version of the sin signal, or held high for a reset. When the D input is high and the shift signal is low, or the sin signal is high and the shift signal is high then datan is low. When datan is low, the d_buf signal is high. Conversely, when the D input is low and the shift signal is low or the sin signal is low and the shift signal is high then datan is high.

The digital logic 902 generally performs functions similar to the first D latch 402. The circuitry (second latch 934) generally performs functions similar to the D latch 404. When the D input and the Q output are equal, the output of the digital logic 902 (at the output of the three-input NOR gate 906) is low. When the clock (clk) is low, nets 916, 918 are both pre-charged to high through transistor 908 and transistor 910, respectively. The high value of net 916 and the high value on net 918 allows an SR-latch, implemented by cross-couple connected gates (NAND gate 928, AND gate 904, and NOR gate 901), to hold data. When clock rises, if D=Q (hence pn1=0), the transistors 912, 914 are both turned on. Accordingly, net 916 and net 918 will remain high. Additionally, because pn1=0, transistor 922 will be off. Therefore, even though clock goes high and the transistor 924 is turned on, the discharging path from either net 916 or net 918 to $V_{ss}$ remains blocked. The result is that, as long as pn1=0, regardless of clock activity, net 916 and net 918 will always be high. Additionally, as long is pn1=0, regardless of clock activity, there will be no switching activity for the SR latch or for Q. The output of the digital logic 902 (which is the output of the three-input NOR gate 906) is the pn1. The pn1 signal may be inverted by the inverter 936 to generate the pn2 signal, which is fed back to the digital logic 902.

When the D input and the Q output are different, a rising edge of the clock signal turns off the transistors 908, 910. (The transistors 912, 914 are off and remain off when the D input and the Q output are different.) When the D input is low and the Q output is high, the transistors 922, 924, 926 will be on when the clock signal transitions to high. The transistor 922 is on because pn1 is high when the D input and the Q output are different. The transistor 924 is on because the clock signal is high. The transistor 926 is on because datan is high. The datan signal is generally the inverse of the D input when shift and reset are low. (The D input is low.) Accordingly, an input to the NAND gate 928 is pulled low. With an input to the NAND gate 928 low, pn4 transitions high. With pn4 high, the Q output transitions low. (The Q output is an inverted version of pn4, inverted by an inverter 920.) Accordingly, the low value on the clock gated D flip-flop 700 is clocked into the Q output (which is now low).

Similarly, when the D input and the Q output are different, with the D input high and the Q output low, the transistors 922, 924, 930 will be on when the clock signal transitions to high. The transistor 922 is on because pn1 is high when the D input and the Q output are different. The transistor 924 is on because the clock is high. The transistor 930 is on because d_buf is high. The d_buf signal is generally equivalent to the D input when shift and reset are low. (The D input is high.) Accordingly, an input to the AND gate 904 is pulled low. With an input of the AND gate 904 low, pn3 transitions high. With pn3 high, pn4 transitions low. With pn4 low, the Q output transitions high. Accordingly, the high value on the clock gated D flip-flop 900 is clocked into the Q output (which is now high).

The data hold-time of the clock gated D flip-flop 900 may be decreased by providing additional feedback to the circuitry making up the first latch, e.g., the digital logic 902. For example, the pn3 signal and the pn4 signal may be fed back to the inputs of the digital logic 902. The pn4 signal may be generated earlier than the Q output (e.g., earlier by a delay through one logic element, inverter 920). Furthermore, the pn3 signal and the pn4 signal may be fed back two levels behind the logical elements of the output of the three-input NOR gate 906, whereas the output of the NOR gate 722 in the example of FIG. 7 is fed back three levels of logic elements of the output of the NOR gate 610. Accordingly, the clock gated D flip-flop 700 may have better (lower) data hold-time as compared to the data hold-time of the clock gated D flip-flop 700.

Figure 10:
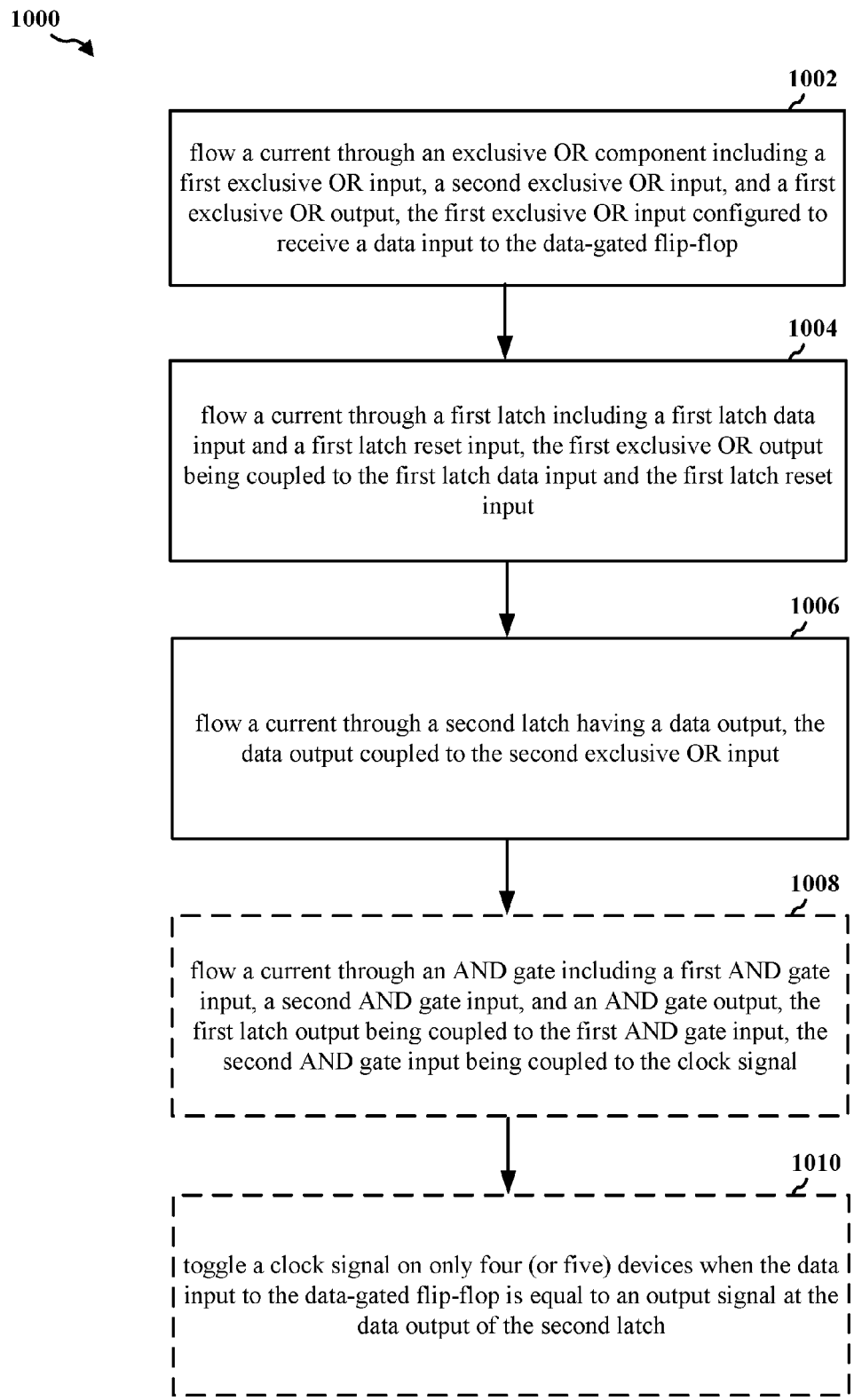
FIG. 10 is a flow chart of an exemplary method of a clock-gating cell.

FIG. 10 is a flowchart of an exemplary method of a clock-gating cell. In one example, the method is performed by a flip-flop (300, 400, 700, 800, 900). At block 1002, a current is flown through an exclusive OR component (306, 406) including a first exclusive OR input, a second exclusive OR input, and a first exclusive OR output. The first exclusive OR input is configured to receive a data input to the data-gated flip-flop.

At block 1004, a current is flown through a first latch (302, 402) including a first latch data input and a first latch reset input. The first exclusive OR output is coupled to the first latch data input and the first latch reset input.

At block 1006, a current is flown through a second latch (304, 404) having a data output. The data output is coupled to the second exclusive OR input.

At block 1008, a current may be flown through an AND gate (308, 408) including a first AND gate input, a second AND gate input, and an AND gate output. The first latch output is coupled to the first AND gate input. The second AND gate input is coupled to the clock signal. The second latch includes a second latch data input, a second latch output, and a second latch clock signal input. The second latch data input is coupled to the data input signal. The AND gate output is coupled to the second latch clock signal input, gating the second latch clock signal. The second latch output is coupled to the second exclusive OR input.

In some examples, a combination of the exclusive OR component (306, 406) and the first latch (302, 402) are implemented using a series of logic gates (410, 602, 604, 606, 608, 610, 612) to generate the first latch output (pn1) based on the D-flip-flop input. Using the clock signal, the series of logic gates implements a function logically equivalent to:

$$pn1(\text{next}) = (\text{clk} \times pn1 + \overline{\text{clk}}) \times (\overline{D} \times Q + D \times \overline{Q}).$$

At block 1010, a clock signal may be toggled on only four devices, e.g., transistors, (or five devices in another example) when the data input to the data-gated flip-flop is equal to an output signal at the data output of the second latch.

Some examples may further include driving the clock signal on a series of transistors at different logic levels within the series of logic gates. Other examples may further include driving the clock signal on a series of transistors at the same logic level within the series of logic gates. In some examples, the first latch comprises a D latch. In some examples, the second latch comprises a D latch.

In one configuration, a flip-flop (300, 400, 700, 800, 900) includes means for flowing a current through an exclusive OR component (306, 406). The exclusive OR component (306, 406) includes a first exclusive OR input, a second exclusive OR input, and a first exclusive OR output. The first exclusive OR input is configured to receive a data input to the data-gated flip-flop. The flip-flop further includes means for flowing a current through a first latch (302, 402, 410, 608, 612, 806, 902). The first latch (302, 402, 410, 808, 902) includes a first latch data input and a first latch reset input. The first exclusive OR output is coupled to the first latch data input and the first latch reset input. The flip-flop (300, 400, 700, 800, 900) includes means for flowing a current through a second latch (304, 404, 714, 934) having a data output. The data output is coupled to the second exclusive OR input. In some configurations, the flip-flop (300, 400, 700, 800, 900) may include logic gates implementing functionality logically equivalent to these means, e.g., simplified logic as described with respect to FIGS. 6-9.

In some configurations the flip-flop (300, 400, 700, 800, 900) may further include means for flowing a current through an AND gate (308, 408). The AND gate (308, 408) may include a first AND gate input, a second AND gate input, and an AND gate output. The first latch output may be coupled to the first AND gate input. The second AND gate input may be coupled to the clock signal. The second latch (304, 404, 714, 914) may include a second latch data input, a second latch output, and a second latch clock signal input. The second latch data input may be coupled to the data input signal. The AND gate output may be coupled to the second latch clock signal input, gating the second latch clock signal. The second latch output may be coupled to the second exclusive OR input. In some configurations, the flip-flop (300, 400, 700, 800, 900) may include logic gates implementing functionality logically equivalent to these means, e.g., simplified logic as described with respect to FIGS. 6-9.

In some configurations, the flip-flop (700, 900) may further include means for toggling a clock signal on only four (700), or in another example, five devices (900), e.g., transistors, when the data input to the data-gated flip-flop is equal to an output signal at the data output of the second latch (714, 914). In some configurations, the flip-flop (700, 900) may include logic gates implementing functionality logically equivalent to these means, e.g., simplified logic as described with respect to FIGS. 7 and 9.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather, "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A data-gated flip-flop comprising:
an exclusive OR component including a first exclusive OR input, a second exclusive OR input, and a first exclusive OR output, the first exclusive OR input configured to receive a data input to the data-gated flip-flop;
a first latch including a first latch output, a first latch data input and a first latch reset input, the first exclusive OR output being coupled to the first latch data input and the first latch reset input; and
a second latch having a data output, the data output coupled to the second exclusive OR input.

2. The data-gated flip-flop of claim 1, further comprising an AND gate including a first AND gate input, a second AND gate input, and an AND gate output, the first latch output being coupled to the first AND gate input, the second AND gate input being coupled to a clock signal, wherein the second latch further includes a second latch data input, and a second latch clock signal input, the second latch data input being coupled to the data input signal, the AND gate output being coupled to the second latch clock signal input.

3. The data-gated flip-flop of claim 1, wherein a combination of the exclusive OR component and the first latch are implemented using a series of logic gates to generate the first latch output (pn1) based on the data input (D), the data output (Q), and using a clock signal (clk), the series of logic gates implementing a function logically equivalent to:

$$pn1(\text{next}) = (\text{clk} \times pn1 + \overline{\text{clk}}) \times (\overline{D} \times Q + D \times \overline{Q}).$$

4. The data-gated flip-flop of claim 3, wherein within the series of logic gates the clock signal toggles on only four devices when the data input to the data-gated flip-flop is equal to an output signal at the data output of the second latch.

5. The data-gated flip-flop of claim 4, wherein the clock signal drives a series of transistors at different logic levels within the series of logic gates.

6. The data-gated flip-flop of claim 3, wherein within the series of logic gates the clock signal toggles on only five devices when the data input to the data-gated flip-flop is equal to an output signal at the data output of the second latch.

7. The data-gated flip-flop of claim 6, wherein the clock signal drives a series of transistors at the same logic level within the series of logic gates.

8. The data-gated flip-flop of claim 1, wherein the first latch comprises a D latch.

9. The data-gated flip-flop of claim 1, wherein the second latch comprises a D latch.

10. A data-gated flip-flop comprising:
a clock gating circuit, the clock gating circuit generating a clock gating signal (pn1), based on a data input (D), a data output (Q), and using a clock signal (clk), the clock gating signal having a logical value logically equivalent to:

$$pn1(\text{next}) = (\text{clk} \times pn1 + \overline{\text{clk}}) \times (\overline{D} \times Q + D \times \overline{Q}); \text{ and}$$

an output latch, a clock to the output latch gated by the clock gating signal.

11. The data-gated flip-flop of claim 10, wherein, within a series of logic gates forming the data-gated flip-flop, the clock signal toggles on only four devices when a data input to the data-gated flip-flop is equal to the data output (Q) of the data-gated flip-flop.

12. The data-gated flip-flop of claim 11, wherein the clock signal drives a series of transistors at different logic levels within the series of logic gates.

13. The data-gated flip-flop of claim 10, wherein, within a series of logic gates forming the data-gated flip-flop, the clock signal toggles on only five devices when the data input (D) to the data-gated flip-flop is equal to an output signal at the data output (Q) of the data-gated flip-flop.

14. The data-gated flip-flop of claim 13, wherein the clock signal drives a series of transistors at the same logic level within the series of logic gates.

15. The data-gated flip-flop of claim 10, wherein the clock gating circuit further comprises an input latch, the input latch comprising a D latch.

16. The data-gated flip-flop of claim 10, wherein the output latch comprises a D latch.

17. A method of operating a data-gated flip-flop comprising:
flowing a current through an exclusive OR component including a first exclusive OR input, a second exclusive OR input, and a first exclusive OR output, the first exclusive OR input configured to receive a data input to the data-gated flip-flop;
flowing a current through a first latch including a first latch output, a first latch data input and a first latch reset input, the first exclusive OR output being coupled to the first latch data input and the first latch reset input; and
flowing a current through a second latch having a data output, the data output coupled to the second exclusive OR input.

18. The method of claim 17, further comprising flowing a current through an AND gate including a first AND gate input, a second AND gate input, and an AND gate output, the first latch output being coupled to the first AND gate input, the second AND gate input being coupled to a clock signal, wherein the second latch further includes a second latch data input, and a second latch clock signal input, the second latch data input being coupled to the data input signal, the AND gate output being coupled to the second latch clock signal input.

19. The method of claim 17, wherein a combination of the exclusive OR component and the first latch are implemented using a series of logic gates to generate the first latch output (pn1) based on the data input (D), the data output (Q), and using a clock signal (clk), the series of logic gates implementing a function logically equivalent to:

$$pn1(\text{next}) = (\text{clk} \times pn1 + \overline{\text{clk}}) \times (\overline{D} \times Q + D \times \overline{Q}).$$

20. The method of claim 17, further comprising toggling a clock signal on only four devices within a series of logic gates forming the data-gated flip-flop when the data input to the data-gated flip-flop is equal to an output signal at the data output of the second latch.

21. The method of claim 20, further comprising driving the clock signal on a series of transistors at different logic levels within the data-gated flip-flop.

22. The method of claim 17, further comprising toggling a clock signal on only five devices within a series of logic gates forming the data-gated flip-flop when the data input to the data-gated flip-flop is equal to an output signal at the data output of the second latch.

23. The method of claim 22, further comprising driving the clock signal on a series of transistors at the same logic level within the data-gated flip-flop.

24. A data-gated flip-flop comprising:
   means for flowing a current through an exclusive OR component including a first exclusive OR input, a second exclusive OR input, and a first exclusive OR output, the first exclusive OR input configured to receive a data input to the data-gated flip-flop;
   means for flowing a current through a first latch including a first latch output, a first latch data input and a first latch reset input, the first exclusive OR output being coupled to the first latch data input and the first latch reset input; and
   means for flowing a current through a second latch having a data output, the data output coupled to the second exclusive OR input.

25. The data-gated flip-flop of claim 24, further comprising means for flowing a current through an AND gate including a first AND gate input, a second AND gate input, and an AND gate output, the first latch output being coupled to the first AND gate input, the second AND gate input being coupled to a clock signal, wherein the second latch further includes a second latch data input, and a second latch clock signal input, the second latch data input being coupled to the data input signal, the AND gate output being coupled to the second latch clock signal input.

26. The data-gated flip-flop of claim 24, wherein a combination of the exclusive OR component and the first latch are implemented using a series of logic gates to generate the first latch output (pn1) based on the data input (D), the data output (Q), and using a clock signal (clk), the series of logic gates implementing a function logically equivalent to:

$$pn1(\text{next}) = (\text{clk} \times pn1 + \overline{\text{clk}}) \times (\overline{D} \times Q + D \times \overline{Q}).$$

* * * * *